United States Patent [19]

Mueller

[11] Patent Number: 4,888,625
[45] Date of Patent: Dec. 19, 1989

[54] OPTOELECTRONIC COUPLING ELEMENT, AND METHOD OF MAKING SAME

[75] Inventor: Ruediger Mueller, Munich, Fed. Rep. of Germany

[73] Assignee: Siemens Aktiengesellschaft, Berlin and Munich, Fed. Rep. of Germany

[21] Appl. No.: 99,578

[22] Filed: Sep. 22, 1987

[30] Foreign Application Priority Data

Sep. 30, 1986 [DE] Fed. Rep. of Germany ....... 3633288
Apr. 16, 1987 [DE] Fed. Rep. of Germany ....... 3713067

[51] Int. Cl.⁴ .................... H01L 31/12; H01L 23/14
[52] U.S. Cl. ...................................... 357/17; 357/19; 357/75
[58] Field of Search .................... 357/17, 19, 75, 30

[56] References Cited

U.S. PATENT DOCUMENTS

| 3,229,104 | 1/1966 | Butz | 250/211 |
|---|---|---|---|
| 3,938,173 | 2/1976 | Jackson et al. | 357/19 |
| 4,001,859 | 1/1977 | Miyoshi et al. | 357/19 |
| 4,122,479 | 10/1978 | Sugawara et al. | 357/19 |
| 4,143,385 | 3/1979 | Miyoshi et al. | 357/19 |
| 4,412,235 | 10/1983 | Bois | 357/19 |
| 4,446,375 | 5/1984 | Aird | 357/19 |
| 4,626,878 | 12/1986 | Kuwano et al. | 357/17 |
| 4,694,183 | 9/1987 | Merrick et al. | 357/19 |

FOREIGN PATENT DOCUMENTS

| 0150929 | 8/1985 | European Pat. Off. . |
|---|---|---|
| 2228303 | 11/1974 | France . |
| 58-7886 | 4/1983 | Japan . |
| 58-37977 | 5/1983 | Japan . |
| 59-103387 | 10/1984 | Japan . |

OTHER PUBLICATIONS

Mori et al., "An Optically-Coupled High-Voltage p-n p-n Crosspoint Array", 12/79 IEEE Journal of Solid-State Circuits, pp. 998 to 1003.

Primary Examiner—Rolf Hille
Assistant Examiner—S. V. Clark
Attorney, Agent, or Firm—John Francis Moran

[57] ABSTRACT

An optoelectronic coupling element having a light-emitting semiconductor device serving as transmitter chip, and a light-receiving semiconductor device serving as a receiver chip, and are firmly connected together through an optic coupling medium (3). This compact coupling element is to have a defined degree of coupling largely independent of the housing and is to be suitable for simple conductor tape mounting. To this end, the coupling medium (3) is an insulating transparent intermediate layer, and the light-emitting semiconductor device (1), the coupling element (3) and the light-receiving semiconductor device (2) are directly laminated one on the other. This optoelectronic coupler is used in particular as an optocoupler for signal transmission.

10 Claims, 1 Drawing Sheet

OPTOELECTRONIC COUPLING ELEMENT, AND METHOD OF MAKING SAME

BACKGROUND OF THE INVENTION

This invention relates to optoelectronic couplers and, it relates, more particularly to an optocoupler utilizing a stacked device arrangement wherein the middle layer serves as both the coupling medium and a mechanical bonding medium.

Optoelectronic coupling elements or optocouplers, also called optoisolators or optoelectronic relays; serve, as are known, to provide feedback-free signal or one directional transmission between two electrically separated circuits, namely a primary and a secondary circuit. They generally comprise a luminescence or light emitting diode, namely a diode emitting light in the visible or infrared wavelength range (LED or IRED type respectively), and a detector, for example a photodiode or a phototransistor which are coupled optically. The advantages of optocouplers over mechanical relays are the elimination of any moving parts, their long life, small size, compatability with semiconductor circuits, and above all their high switching rate or fast response time.

In optocouplers, photoemitters and photoreceivers are usually mounted on separate lead frames and arranged so that as large a portion of the emission radiation as possible falls on the receiver surface of the photodetector. The optic coupling can be improved by an intermediate layer of synthetic material which brings about at the same time an increased amount of electric insulation.

In modern optocouplers, for the primary side and secondary side separate lead frames are utilized on which the transmitter and receiver chips are applied and contacted by the usual methods. The two tapes are brought together. The light channel is produced by dabbling, cladding or sealing. Thereafter the light channel is coated with a reflecting layer and the entire component is externally coated or clad with synthetic material to provide the finished product. Instead of two split lead frames, which permit constructing the transmitter and receiver chips opposite each other, a single lead frame method with coplanar construction of the transmitter and receiver chips may be used.

Due to the complexity of construction of an optoelectronic coupling element having, for example, an infrared transmitter chip, an insulating light transmission path (coupling medium) and a receiver chip such as arrangement is relatively costly.

SUMMARY OF THE INVENTION

It is an object of the invention to provide an optoelectronic coupling element with a defined degree of coupling largely independent of the housing, the construction of which requires relatively little expense and hence is cost-effective, and which furthermore requires little space and is suitable for easy mounting on the lead frame.

According to the invention, this problem is solved by an optoelectronic coupling element including a transmitter chip and a receiver chip firmly joined together by an optical coupling medium wherein the two chips are stacked one on the other.

In some of the further aspects of the invention, the coupling medium may be formed within one of the chips. The chips have contacting surfaces and the coupling medium comprises either silicon nitride, aluminum nitride, or silicon dioxide. The coupling medium may comprise a deposited layer of monocrystalline silicon or an insulating layer on either of the two chips. Alternatively, monocrystalline GaAs may be applied. Various techniques are presented to realize the different structures in accordance with the principles of the invention.

The advantages achieved with the invention consist in particular in that the construction of the proposed optoelectronic coupling element is very simple and may be performed through the use of conventional devices available from semiconductor technology.

The optoelectronic coupling element is distinguished by a defined degree of coupling largely independent of the housing and is especially suitable for easy lead frame mounting.

The optoelectronic coupling element is usable in particular as a basic optocoupler.

The optoelectronic coupling element of the invention is an elementary coupler which includes a photoemitter, an insulating transparent intermediate layer, and a phototransistor in laminated or sandwich construction.

The three layers may preferably be either produced separately and then laminated, e.g. glued, as wafers, or they may be arranged on a common substrate, e.g. the GaAs of the photoemitter. In the latter case it is necessary to apply on the insulating layer, which appropriately consists of silicon nitride, aluminum oxide or silicon dioxide, a silicon layer, if possible a monocrystalline one, for the photoreceiver, e.g. a phototransistor or photodiode.

To produce such layers or layer sequences, present methods are suitable, e.g. the usual silicon oxide techniques. Also methods known per se for the production of light-emitting semiconductor diodes (LED production) on SiO₂ intermediate layers are usable (e.g. molecular beam epitaxy).

Instead of a transparent insulating intermediate layer, e.g. of silicon dioxide, as coupling medium, organic transparent insulating intermediate layers, e.g. in the form of foils or lacquers, are conceivable.

BRIEF DESCRIPTION OF THE DRAWING

The invention will be further explained with reference to embodiments illustrated in the figures of drawing purely schematically. Parts which do not necessarily contribute to comprehension of the invention are not labeled in the figures or are omitted.

DETAILED DESCRIPTION

Figure 1:
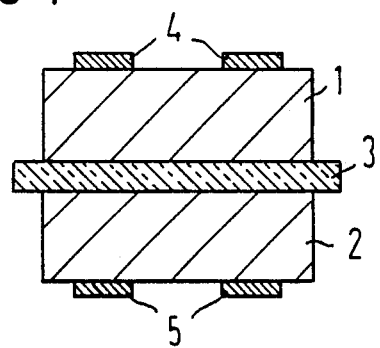
FIG. 1 shows the new optoelectronic coupling element schematically in section.

The optoelectronic coupling element shown in FIG. 1 essentially comprises the light-emitting semiconductor component 1 (transmitter chip), and a light-receiving semiconductor component 2 (receiver chip), which are firmly connected together through an optic coupling medium 3. The coupling medium 3 is an insulating transparent intermediate layer. The light-emitting semiconductor component 1, the coupling medium 3, and the light-receiving semiconductor component 2 are joined together in a stacked lamination arrangement. The firm joining of the three parts is carried out preferably with a fast-curing adhesive on their contact surfaces. The transmitter chip 1 is provided with the two terminal contacts 4, and the receiver chip 2 with the two terminal contacts 5.

Figure 2:
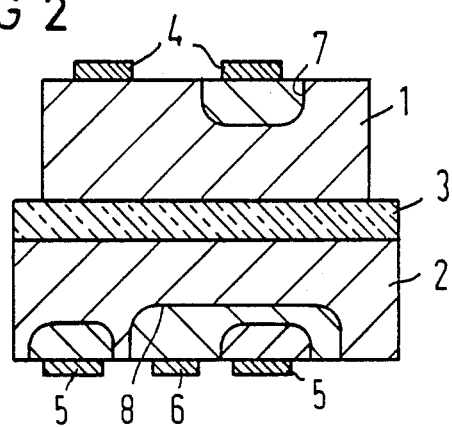
FIG. 2, another optoelectronic coupling element according to the invention, schematically in cross-sectional form.

In the illustrate embodiment depicted in FIG. 2, the three parts of the optoelectronic coupling element, namely transmitter chip 1, coupling medium 3 and receiver chip 2, are stacked in the form of two disks in laminated union. One disk, the transmitter chip 1, is for example a diffused GaAs diode. The other disk constituents the receiver chip 2, for example a Si phototransistor mounted via a face-down semiconductor technique, and a $SiO_2$ layer applied on the back as a transparent insulating intermediate layer serving as coupling medium 3. In the application of transparent, insulative, coupling layer other suitable materials include silicon nitride, aluminum oxide, in addition to silicon dioxide. In some cases, the material deposited or in the form of a separate piece may be in monocrystalline form. After the semiconductor double disk with insulating intermediate layer has been sawed out, the diameter of the transmitter chip 1 comprising the gallium arsenide is reduced. This is done advantageously by etching selectively the GaAs chip 1. By this advantageous measure, one achieves an enlargement of the leakage distance between transmitter chip 1 and receiver chip 1 and hence an increase in the dielectric strength between these two active components.

Another possibility is the usual chip mounting of individual transmitter chips 1 on the unsawed receiver disk 2 with intermediate layer 3 and subsequent singling of the disk 2.

The transmitter chip 1 is provided with the two terminal contacts 4, and the receiver chip 2 with the two terminal contacts 5. In certain cases, a base contact 6 is further provided on the receiver chip 2. The silicon layer thickness, i.e. the distance of the top side of the receiver chips 2 from its light-receiving pn junction 8, is adapted to the depth of penetration of the optic wavelength of the radiation emanating from the light-emitting pn junction 7 of the transmitter chip 1.

The completion of the optoelectronic coupling element, e.g. the contacting of the phototransistor used as light receiver, should be done preferably via face-down mounting on conductor tape. Thereafter the terminals at the top may be bonded as usual to the same conductor tape. After soft covering of the light sender, e.g. in dabbling technique or a similar method, the externally enveloping of the coupling element may be accomplished by cladding.

There has thus been shown and described a novel optocoupler which fulfills all the objects and advantages sought therefor. Many changes, modifications, variations and other uses and applications of the subject invention will, however, become apparent to those skilled in the art after considering this specification and the accompanying drawing which disclose the preferred embodiments thereof. All such changes, modifications, variations and other uses and applications which do not depart from the spirit and scope of the invention are deemed to be covered by the invention which is limited only by the claims which follow.

I claim:

1. An optoelectronic coupler comprising a light-emitting semiconductor device in the form of a transmitter chip, and a light-receiving semiconductor device in the form of a receiver chip, an optical coupling medium being insulative and transparent and fixedly joining together the two chips, each of said two chips having contact terminals on a surface opposite to the optical coupling medium the optical coupling medium being an intermediate layer and providing the sole mechanical binding between transmitter chip, and said receiver chip, the light-emitting semiconductor device, the coupling medium and the light-receiving semiconductor device being joined together adhesively by stacking directly one on the other wherein the contact terminals are disposed on opposing surfaces of the two chips joined together, and the coupling medium is formed as part of one of the two chips.

2. An optoelectronic coupler comprising a light-emitting semiconductor device in the form of a transmitter chip, a light-receiving semiconductor device in the form of a receiver chip, an optical coupling medium being insulative and transparent and fixedly joining together the two chips, the optical coupling medium being an intermediate layer whose area essentially corresponds to an area coextensive to the two chips, the light-emitting semiconductor device, the coupling medium and the light-receiving semiconductor device being joined together adhesively by stacking directly one on the other and the coupling medium provides the sole mechanical bond between the two chips, each one of the two chips having contact terminals on one surface located away from the coupling medium so that when the two devices are joined the contact terminals are on opposing surfaces of the devices joined together, and the coupling medium has contacting surfaces one glued to a contact surface of the light-emitting semiconductor device and the other glued to the light-receiving semiconductor device.

3. An optoelectronic coupling element according to claim 1, wherein the coupling medium comprises one of the group consisting of silicon nitride aluminum oxide or silicon dioxide.

4. An optoelectronic coupling element according to claim 2, wherein the coupling medium comprises one of the group consisting of silicon nitride aluminum oxide or silicon dioxide.

5. An optoelectronic coupler according to claim 1, wherein a monocrystalline silicon layer is applied on the insulating transparent intermediate layer forming the coupling medium for receiving the light-receiving semiconductor component.

6. An optoelectronic coupler according to claim 2, wherein a monocrystalline silicon layer is applied on the insulating transparent intermediate layer forming the coupling medium for receiving the light-receiving semiconductor component.

7. An optoelectronic coupling element according to claim 1, wherein a monocrystalline GaAs layer is applied on the insulating transparent intermediate layer forming the coupling medium for the light-emitting semiconductor.

8. An optoelectronic coupling element according to claim 2, wherein a monocrystalline GaAs layer is applied on the insulating transparent intermediate layer forming the coupling medium for the light-emitting semiconductor.

9. An optoelectronic coupling element according to claim 2, wherein a monocrystalline GaAs layer is applied on the insulating transparent intermediate layer forming the coupling medium for the light-emitting semiconductor.

10. An optoelectronic coupling element according to claim 1, wherein the coupling medium has an active region for the light-emitting semiconductor device of smaller area than for the light-receiving semiconductor device.

* * * * *